(12) United States Patent
Kobayashi (10) Patent No.: US 9,117,857 B2
(45) Date of Patent: Aug. 25, 2015

(54) CEILING ELECTRODE PLATE AND SUBSTRATE PROCESSING APPARATUS

(75) Inventor: Yoshiyuki Kobayashi, Miyagi (JP)

(73) Assignee: TOKYO ELECTRON LIMITED (JP)

( * ) Notice: Subject to any disclaimer, the term of this patent is extended or adjusted under 35 U.S.C. 154(b) by 492 days.

(21) Appl. No.: 13/435,631

(22) Filed: Mar. 30, 2012

(65) Prior Publication Data

US 2012/0247672 A1    Oct. 4, 2012

Related U.S. Application Data

(60) Provisional application No. 61/537,724, filed on Sep. 22, 2011.

(30) Foreign Application Priority Data

Mar. 31, 2011  (JP) .................................. 2011-079732

(51) Int. Cl.
  C23F 1/00        (2006.01)
  H01L 21/67       (2006.01)
  H01J 37/32       (2006.01)

(52) U.S. Cl.
  CPC ....... *H01L 21/67109* (2013.01); *H01J 37/3244* (2013.01); *H01J 37/32532* (2013.01); *H01L 21/67103* (2013.01)

(58) Field of Classification Search
  CPC ..................... C23C 16/45565; C23C 16/4557; C23C 16/45572; H01J 37/3244; H01J 37/32532; H01L 21/67109; H01L 21/67103
  See application file for complete search history.

(56) References Cited

U.S. PATENT DOCUMENTS

| | | | |
|---|---|---|---|
| 6,831,307 B2 * | 12/2004 | Fujii | 257/180 |
| 7,661,386 B2 * | 2/2010 | Kasai et al. | 118/666 |
| 2004/0070084 A1 * | 4/2004 | Kuramoto et al. | 257/779 |
| 2005/0000442 A1 * | 1/2005 | Hayashi et al. | 118/723 E |
| 2007/0187038 A1 * | 8/2007 | Ren et al. | 156/345.43 |
| 2008/0236752 A1 | 10/2008 | Honda | |
| 2009/0163034 A1 * | 6/2009 | Larson et al. | 438/729 |
| 2010/0184298 A1 * | 7/2010 | Dhindsa | 438/710 |

FOREIGN PATENT DOCUMENTS

| | | |
|---|---|---|
| JP | 11256370 | 9/1999 |
| JP | 2002-016126 | 1/2002 |
| JP | 2003045854 | 2/2003 |
| JP | 2003158120 | 5/2003 |
| JP | 2004342704 | 12/2004 |
| JP | 2008244096 | 10/2008 |
| WO | 2010019197 | 2/2010 |

* cited by examiner

*Primary Examiner* — Gordon R Baldwin
*Assistant Examiner* — Charlee Bennett
(74) *Attorney, Agent, or Firm* — Cantor Colburn LLP (57) ABSTRACT

In a plasma processing apparatus, a ceiling electrode plate provided to face a substrate holding stage via a process space contacts and is supported by an electrode support by interposing a cooling plate, and a heat-transfer sheet is provided in a contact surface between the ceiling electrode plate and the cooling plate. The heat-transfer sheet has thermal conductivity of 0.5 to 2.0 W/m·K. The heat-transfer sheet is provided of a heat-resistant adhesive agent or a rubber including silicon, or the heat-transfer sheet is formed of a ceramic filler including oxide, nitride, or carbide. The ceramic filler of 25 to 60 volume % is contained in the heat-resistant adhesive agent or the rubber. A thickness of the heat-transfer sheet is in a range between 30 and 80 μm, and the heat-transfer sheet is not provided in a predetermined area around gas holes of the ceiling electrode plate.

8 Claims, 5 Drawing Sheets

CEILING ELECTRODE PLATE AND SUBSTRATE PROCESSING APPARATUS

CROSS-REFERENCE TO RELATED PATENT APPLICATIONS

This application claims the benefits of Japanese Patent Application No. 2011-079732, filed on Mar. 31, 2011 in the Japan Patent Office, and the U.S. Patent Application No. 61/537,724, filed on Sep. 22, 2011 in the U.S. Patent and Trademark Office, the disclosures of which are incorporated herein in its entirety by reference.

BACKGROUND OF THE INVENTION

1. Field of the Invention

The present invention relates to a ceiling electrode plate and a substrate processing apparatus, and more particularly, to a ceiling electrode plate provided to face a substrate holding stage by interposing a process space therebetween.

2. Description of the Related Art

A substrate processing apparatus, which performs an etching process on a wafer serving as a substrate, includes a chamber that accommodates the wafer and may be depressurized, a substrate holding stage that is provided inside the chamber and on which the wafer is placed, and a ceiling electrode plate (CEL) provided to face the substrate holding stage by interposing a process space therebetween. Plasma is generated in the depressurized chamber, and the plasma is used to etch the wafer. The ceiling electrode plate is supported by an electrode supporting unit (UEL) by interposing a cooling plate that serves as a heat diffusion plate.

When a plasma process, for example, an etching process, is performed on the wafer, an etching rate (E/R) of each portion of the wafer is influenced by a temperature of each portion, and thus there is a need to uniformly maintain surface temperatures of elements provided inside the chamber, for example, the wafer, the substrate holding stage, the ceiling electrode plate, etc., during the etching process. However, since the inside of the chamber is held in a vacuum state, it is difficult to transfer heat between the elements provided inside the chamber, and it takes time to stabilize temperatures of the elements.

Also, during the etching process of the wafer, heat generated from plasma is applied to the ceiling electrode plate provided over the substrate holding stage on which the wafer is placed, and a temperature of the ceiling electrode plate is changed. The temperature of the ceiling electrode plate affects distribution of radicals included in the plasma of the process space, and thus if the temperature of the ceiling electrode plate is changed while a plurality of the wafers in the same lot are processed, it is difficult to uniformly perform an etching process on the plurality of wafers in the same lot. Accordingly, a coolant passage, through which a coolant including, for example, a cooling water, flows, is provided as a temperature adjusting mechanism in the electrode support that supports the ceiling electrode plate. Thus, the ceiling electrode plate is cooled via the cooling plate that serves as a heat diffusion plate, thereby adjusting the temperature of the ceiling electrode plate that is directly influenced by heat generated from the plasma.

However, adhesion strengths of a contact surface between the ceiling electrode plate and the cooling plate and a contact surface between the cooling plate and the electrode support are not so high, and heat transfer efficiency therebetween is low due to the vacuum atmosphere. Accordingly, a time lag occurs in controlling the temperature of the ceiling electrode plate, and thus it is difficult to adjust the temperature of the ceiling electrode plate to a desired temperature from when generation of the plasma begins, thereby causing instability of a process property such as etching rates of wafers.

On the other hand, a temperature adjusting technology for improving heat transfer efficiency between elements of a plasma processing apparatus has been recently developed by the present applicant (refer to, for example, Patent Reference 1). In this technology, a heat transfer sheet is provided between the elements of the plasma processing apparatus, for example, between a focus ring and a susceptor, to improve heat transfer efficiency.

However, an applicable technology of the above-described heat transfer sheet has not necessarily been established, and particularly, a technology that is applicable to a ceiling electrode plate, which is heated by directly receiving heat generated from plasma, has not been sufficiently established.

3. Prior Art Reference (Patent Reference 1) Japanese Patent Laid-Open Publication No. 2002-016126

SUMMARY OF THE INVENTION

The present invention provides a ceiling electrode plate and a substrate processing apparatus that may stabilize a temperature of the ceiling electrode plate from when generation of plasma begins and that may uniformly perform an etching process on a plurality of wafers.

According to an aspect of the present invention, a ceiling electrode plate is supported to be suspended from an electrode support including a temperature adjusting mechanism, wherein the ceiling electrode plate contacts the electrode support via a cooling plate, wherein a heat-transfer sheet is provided in a contact surface of the ceiling electrode plate between the ceiling electrode plate and the cooling plate.

A plurality of gas holes may be provided in the ceiling electrode plate, and the heat-transfer sheet is not provided in a predetermined area around the gas holes.

The heat-transfer sheet may not be provided in a circular area having a radius of 1.5 mm to 2.5 mm centering around the gas holes.

A thickness of the heat-transfer sheet may be equal to or less than 100 μm.

The thickness of the heat-transfer sheet may be in a range between 30 and 80 μm.

The ceiling electrode plate may be provided to face a substrate holding stage via a process space, wherein the thickness of the heat-transfer sheet is different at a position facing a center portion of the substrate holding stage and at a position facing a peripheral portion of the substrate holding stage.

A parting agent may be coated on contact surfaces of the cooling plate between the cooling plate and the heat-transfer sheet.

The heat-transfer sheet may be provided in a contact surface between the cooling plate and the electrode support.

Thermal conductivity of the heat-transfer sheet may be in a range between 0.5 and 2.0 W/m·K.

A substrate processing apparatus includes a ceiling electrode plate and a substrate holding stage provided to face the ceiling electrode plate via a process space and performs a predetermined process on a substrate placed on the substrate holding stage, wherein the substrate processing apparatus includes the ceiling electrode plate of the above inventions.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail by explaining exemplary embodiments of the invention with reference to the attached drawings.

Figure 1:
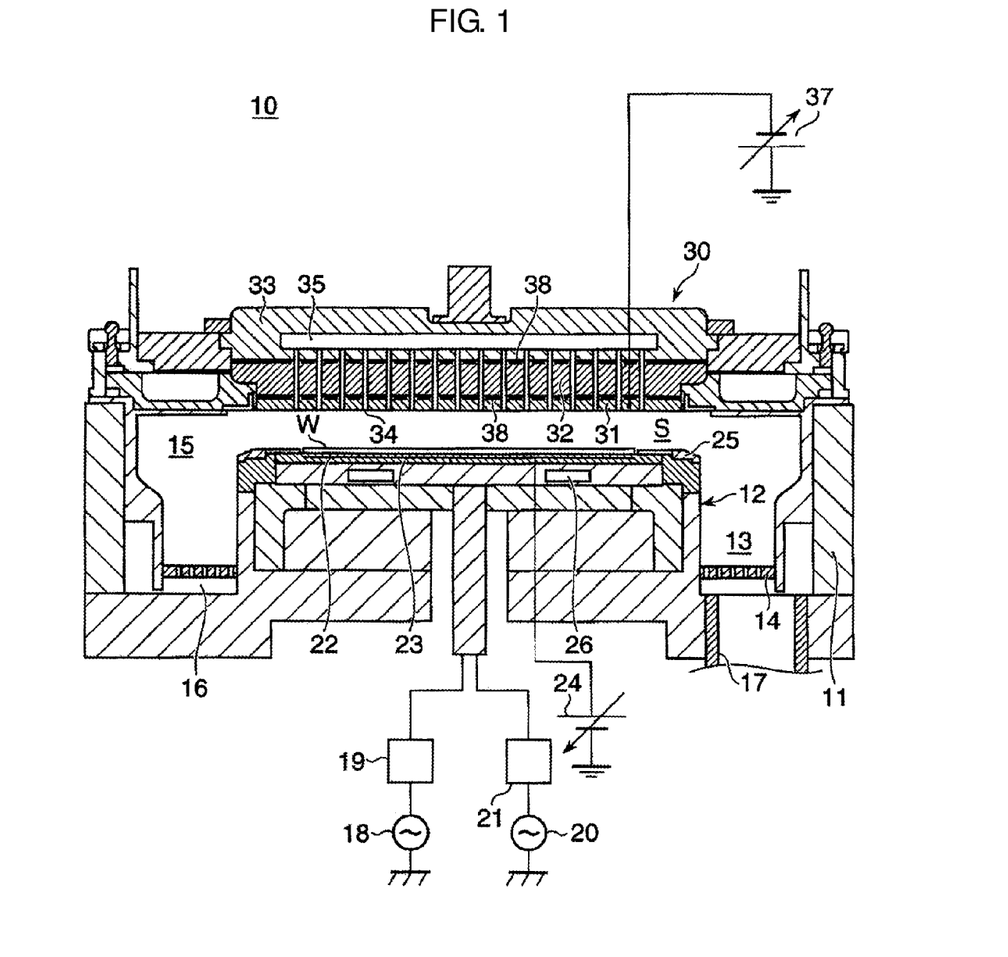
FIG. 1 is a schematic cross-sectional view of a plasma processing apparatus including a ceiling electrode plate according to an embodiment of the present invention.

FIG. 1 is a schematic cross-sectional view of a plasma processing apparatus including a ceiling electrode plate according to an embodiment of the present invention. The plasma processing apparatus 10 performs a plasma etching process on a wafer for semiconductor devices (hereinafter, simply referred to as a wafer W) which serves as a substrate.

In FIG. 1, the plasma processing apparatus 10, which is a substrate processing apparatus, includes a chamber 11 accommodating the wafer W having a diameter of, for example, 300 mm. A susceptor 12, which has a cylindrical shape and on which the wafer W for semiconductor devices is placed, is provided in the chamber 11. In the plasma processing apparatus 10, a side exhaust path 13 is provided by an inner side wall of the chamber 11 and a side wall of the susceptor 12. An exhaust plate 14 is provided in the side exhaust path 13.

The exhaust plate 14 has a plate shape having a plurality of through-holes and serves as a dividing plate for dividing an inside of the chamber 11 into an upper portion 15 and a lower portion 16. As will be described later, plasma is generated in the upper portion 15 (hereinafter, referred to as a processing chamber) inside the chamber 11 divided by the exhaust plate 14. Also, an exhaust pipe 17 for exhausting a gas inside the chamber 11 is connected to the lower portion 16 (hereinafter, referred to as an exhaust room (manifold)) inside the chamber 11. The exhaust plate 14 captures or reflects the plasma generated in the processing chamber 15 to prevent the plasma from leaking to the manifold 16.

A turbo molecular pump (TMP) (not shown) and a dry pump (DP) (not shown) are connected to the exhaust pipe 17, and the TMP and the DP perform a vacuum suction in the chamber 11 to depressurize the inside of the chamber 11. Specifically, the DP depressurizes the inside of the chamber 11 from atmospheric pressure to a medium vacuum state (for example, equal to or less than $1.3 \times 10$ Pa (0.1 Torr)), and the TMP cooperates with the DP to depressurize the inside of the chamber 11 to a high vacuum state (for example, equal to or less than $1.3 \times 10^{-3}$ Pa ($1.0 \times 10^{-5}$ Torr)) which is a lower pressure state than a medium vacuum state. Also, pressure inside the chamber 11 is controlled by an APC valve (not shown).

A first high-frequency power source 18 is connected to the susceptor 12 provided inside the chamber 11 via a first matching unit 19, and a second high-frequency power source 20 is connected to the susceptor 12 via a second matching unit 21. The first high-frequency power source 18 applies ion-dragging high-frequency power of a relatively low frequency, for example, 2 MHz, to the susceptor 12, and the second high-frequency power source 20 applies plasma generating high-frequency power of a relatively high frequency, for example, 60 MHz, to the susceptor 12. Accordingly, the susceptor 12 serves as an electrode. The first matching unit 19 and the second matching unit 21 reduce high-frequency power reflected from the susceptor 12 to maximize application efficiency of the high-frequency power applied to the susceptor 12.

An electrostatic chuck 23 including an electrostatic electrode plate 22 and formed of ceramic is provided at an upper portion of the susceptor 12. A DC power source 24 is connected to the electrostatic electrode plate 22, and thus if a positive DC voltage is applied to the electrostatic electrode plate 22, a negative potential is generated in a surface (hereinafter, referred to as a rear side) of the wafer W adjacent to the electrostatic chuck 23 to generate an electric field between the rear surface of the wafer W and the electrostatic electrode plate 22. The wafer W is adsorbed to and held by the electrostatic chuck 23 due to a Coulomb force or a Johnson-Rahbek force resulting from the electric field.

Also, a focus ring 25 is placed on the susceptor 12 to surround the wafer W that is adsorbed to and held by the electrostatic chuck 23. The focus ring 25 is formed of silicon (Si), silicon carbide (SiC), or the like. In other words, since the focus ring 25 is formed of a semiconductor, an area where the plasma is diffused is expanded not only on the wafer W but also over the focus ring 25, and thus the plasma on a peripheral portion of the wafer W is maintained to have the same intensity as the plasma on a center portion of the wafer W. Accordingly, uniformity of a plasma etching process performed on the entire surface of the wafer W is secured.

A coolant room 26 having an annular shape is provided inside the susceptor 12 to extend, for example, in a circumferential direction. A low-temperature coolant, for example, a cooling water or Galden (registered trademark), is cyclically supplied to the coolant room 26 from a chiller unit via a pipe (not shown) for a coolant. The susceptor 12 that is cooled by the low-temperature coolant cools the wafer W and the focus ring 25.

The electrostatic chuck 23 includes a plurality of heat-transfer gas supply holes (not shown) that are opened toward the wafer W that is adsorbed to and held by the electrostatic chuck 23. The plurality of heat-transfer gas supply holes are connected to a heat-transfer gas supply unit (not shown) via a heat-transfer gas supply line, and the heat-transfer gas supply unit supplies a He gas, which is a heat-transfer gas, to a gap between an adsorption surface of the electrostatic chuck 23 and the rear surface of the wafer W via the heat-transfer gas supply holes. The He gas supplied to the gap between the adsorption surface of the electrostatic chuck 23 and the rear surface of the wafer W effectively transfers heat of the wafer W to the susceptor 12.

A shower head 30 is provided in a ceiling portion of the chamber 11 via a process space S to face the susceptor 12. The shower head 30 includes a ceiling electrode plate 31, an electrode support 33 for detachably supporting the ceiling electrode plate 31 suspended from the shower head 30, and a cooling plate 32 interposed between the electrode support 33 and the ceiling electrode plate 31. The cooling plate 32 and the ceiling electrode plate 31 are formed of a disk-shaped unit having a plurality of gas holes 34 provided in a thickness direction, and the cooling plate 32 and the ceiling electrode plate 31 are formed of, for example, silicon, SiC (silicon carbide), quartz, or the like that is a semiconductor. Also, a coolant passage (not shown) for temperature adjustment and a buffer chamber 35 are provided inside the electrode support 33, and a process gas introducing pipe (not shown) is connected to the buffer chamber 35.

Furthermore, a DC power source 37 is connected to the ceiling electrode plate 31 of the shower head 30 to apply a negative DC voltage to the ceiling electrode plate 31. At this time, the ceiling electrode plate 31 discharges secondary electrons to prevent an electron density inside the processing chamber 15 from being decreased.

Also, a heat-transfer sheet 38 to be described later are respectively provided in the contact surface between the ceiling electrode plate 31 and the cooling plate 32 and the contact surface between the cooling plate 32 and the electrode support 33. The heat-transfer sheet 38 respectively fills minute gaps provided in the contact surface between the ceiling electrode plate 31 and the cooling plate 32 and the contact surface between the cooling plate 32 and the electrode support 33 and thus improve heat-transfer efficiency of each contact surface and effectively transfer heat of the ceiling electrode plate 31 to the electrode support 33 via the cooling plate 32.

In the plasma processing apparatus 10, a process gas supplied to the buffer chamber 35 from the process gas introducing pipe is introduced to the process space S provided inside the processing chamber 15 via the gas holes 34, and the introduced process gas is excited by plasma-generating high-frequency power applied into the processing chamber 15 from the second high-frequency power source 20 via the susceptor 12 to be plasma. Ions included in the plasma are dragged toward the wafer W by ion-dragging high-frequency power applied to the susceptor 12 by the first high-frequency power source 18, thereby performing a plasma etching process on the wafer W.

The above-described operations of the elements included in the plasma processing apparatus 10 are controlled by a CPU of a controller (not shown) included in the plasma processing apparatus 10 according to a program corresponding to the plasma etching process.

Figure 2:
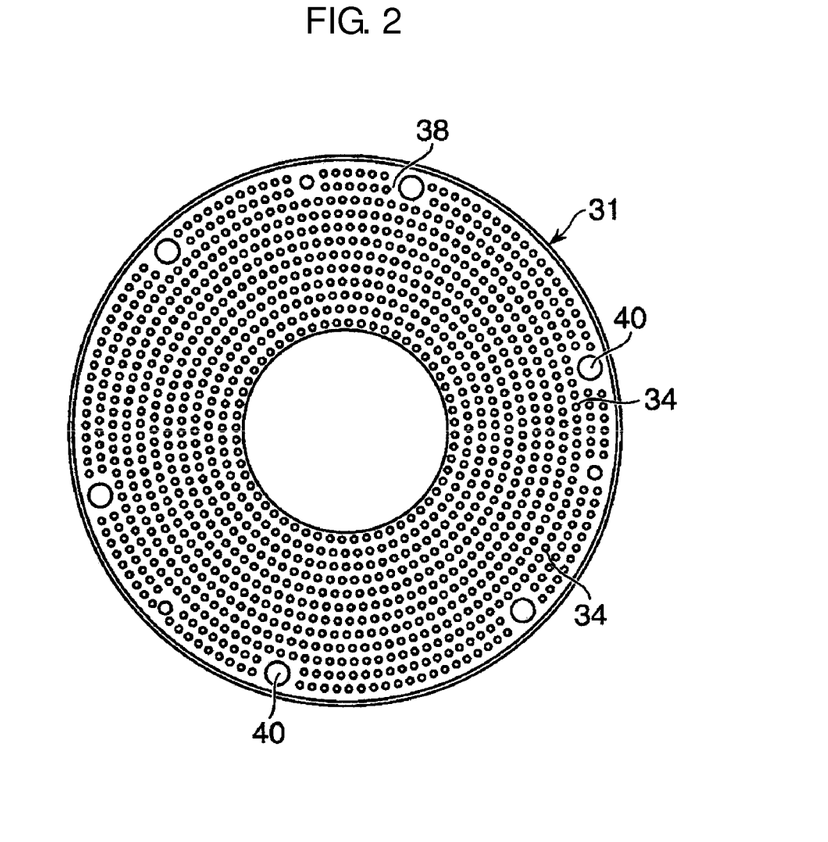
FIG. 2 is a view showing a surface of the ceiling electrode plate of the plasma processing apparatus of FIG. 1 that contacts a cooling plate.
Figure 3:
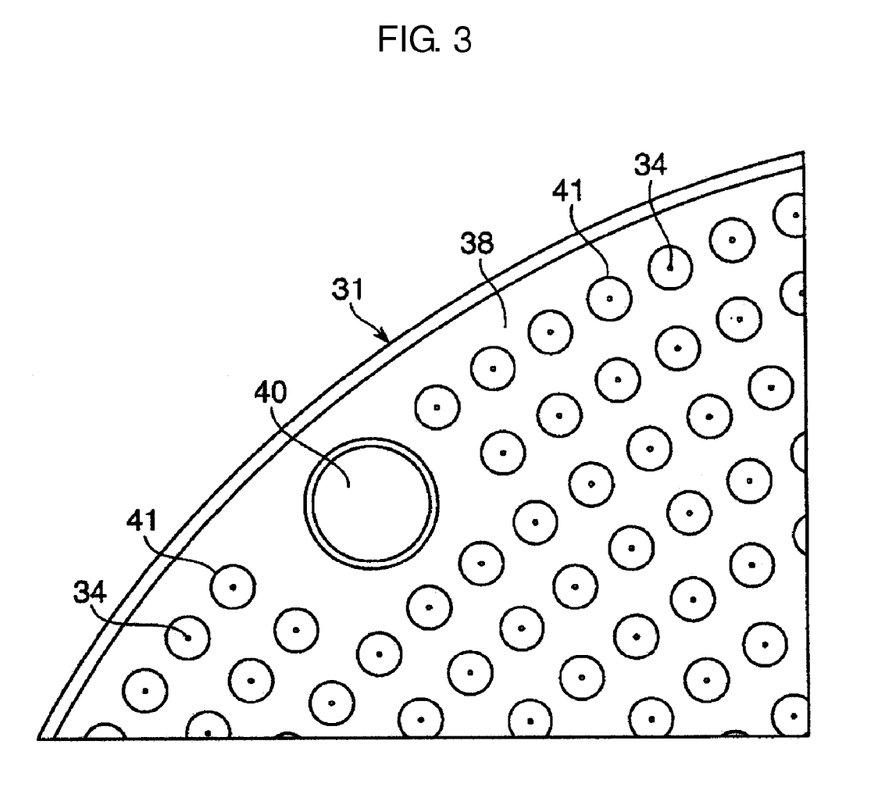
FIG. 3 is a partial enlarged plane view of the ceiling electrode plate of FIG. 2.
Figure 4:
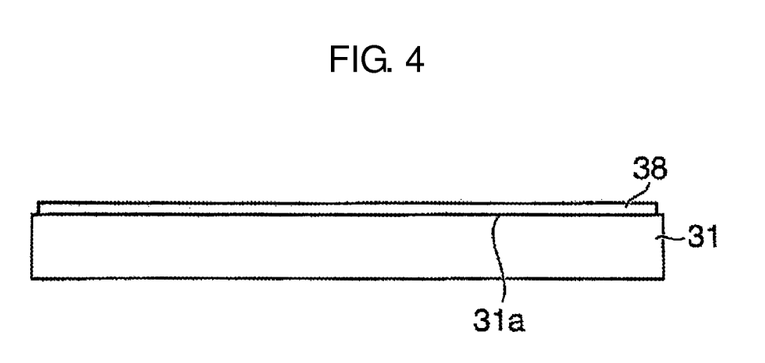
FIG. 4 is a side view of the ceiling electrode plate of FIG. 2.

FIG. 2 is a view showing a surface of the ceiling electrode plate in the plasma processing apparatus of FIG. 1 that contacts the cooling plate. FIG. 3 is a partial enlarged plane view of the ceiling electrode plate of FIG. 2. FIG. 4 is a side view of the ceiling electrode plate of FIG. 2.

In FIG. 2, the ceiling electrode plate 31 has a circular plate shape, and a diameter of the ceiling electrode plate 31 is nearly the same as, for example, a diameter of the susceptor 12 on which the wafer W is placed. A thickness of the ceiling electrode plate 31 is in a range of, for example, between 5 and 20 mm. The heat-transfer sheet 38 is provided in the contact surface between the ceiling electrode plate 31 and the cooling plate 32.

The heat-transfer sheet 38 is provided by preparing a solution (hereinafter, referred to as a "mixture A") obtained by mixing XE14-B8530 (A) (manufactured by Momentive Performance Materials) and XE14-B8530 (B) (manufactured by Momentive Performance Materials), which are polyorganosiloxane, at a weight ratio of 1:1; preparing a solution (hereinafter, referred to as a "mixture B") obtained by adding DAMS (manufactured by Denkikagaku Kogyo, Co., Ltd., having an average particle diameter of 5 μm) as an alumina filler to the mixture A so as to satisfy a volume ratio of 60:40 (mixture A:alumina filler) and adding RD-1 (manufactured by Dow Corning Toray Silicone Co., Ltd.), which is a crosslinkable polyorganosiloxane-based hardening agent, to the mixture of the mixture A and the alumina filler so as to have a weight of 0.04% with respect to the sum of the mixture A and the alumina filler; applying the mixture B on a contact surface 31a between the ceiling electrode plate 31 and the cooling plate 32 by using, for example, a screen printing method via a predetermined masking material for providing openings 41 corresponding to the gas holes 34 so as to form a desired film thickness; and then heat hardening the mixture B at a temperature of, for example, 150° C. for 30 hours. Thermal conductivity of the heat-transfer sheet 38 is measured by using a laser flash method using a test piece in which only the mixture B is hardened, and the thermal conductivity was 1.2 W/m·K.

In FIGS. 3 and 4, a plurality of gas holes 34 are provided in the ceiling electrode plate 31, and the openings 41 corresponding to the gas holes 34 are provided in the heat-transfer sheet 38 provided in the contact surface 31a between the ceiling electrode plate 31 and the cooling plate 32. The gas holes 34 provided in the ceiling electrode plate 31 are through holes having a diameter of, for example, ϕ0.5 mm, and the openings 41 provided in the heat-transfer sheet 38 are circular holes having a diameter of, for example, ϕ3 mm to ϕ5 mm. The heat-transfer sheet 38 is provided in such a way that the gas holes 34 are respectively positioned in the center portions of the openings 41. Accordingly, the openings 41 of the heat-transfer sheet 38 are provided in a concentric shape together with the gas holes 34, and the heat-transfer sheet 38 is not provided in a predetermined area around the gas holes 34, that is, in a circular area having a radius of, for example, 1.5 mm to 2.5 mm centering around the gas holes 34.

Figure 5:
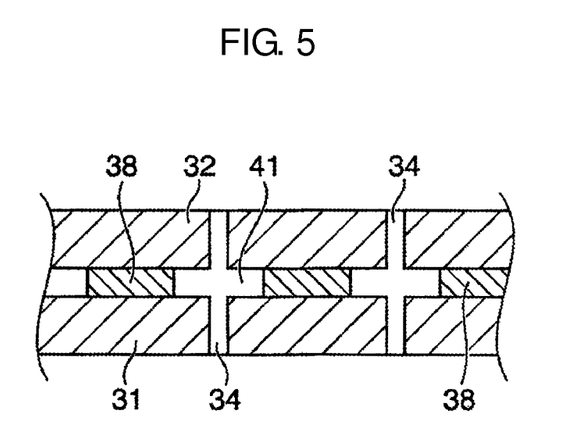
FIG. 5 is a partial enlarged cross-sectional view of a contact portion between the ceiling electrode plate and the cooling plate.

FIG. 5 is a partial enlarged cross-sectional view of a contact portion between the ceiling electrode plate 31 and the cooling plate 32.

In FIG. 5, the gas holes 34 of the ceiling electrode plate 31 and the gas holes 34 of the cooling plate 32 are respectively provided to communicate with each other, for example, at regular intervals. The heat-transfer sheet 38 is provided in the contact surface between the ceiling electrode plate 31 and the cooling plate 32, and the openings 41 are provided at portions of the heat-transfer sheet 38 corresponding to the gas holes 34. In other words, the openings 41 of the heat-transfer sheet 38 and the gas holes 34 of the ceiling electrode plate 31 are provided to communicate with each other, and the gas holes 34 are connected to approximately the center portions of the openings 41. Accordingly, a route in which plasma introduced through the gas holes 34 moves to the heat-transfer sheet 38 has a labyrinth shape. Thus, even if the plasma is introduced through the gas holes 34, it is difficult for the plasma to arrive at the heat-transfer sheet 38, and also the heat-transfer sheet 38 may be prevented from being exposed to the plasma, thereby preventing the heat-transfer sheet 38 from being damaged and preventing generation of particles.

Bolt holes 40 are provided in the ceiling electrode plate 31 to contact and fix the ceiling electrode plate 31 and the cooling plate 32 (refer to FIGS. 2 and 3), and the heat-transfer sheet 38 is provided not to contact the bolt holes 40. Also, since there is no possibility that plasma enters the bolt holes 40, openings of the heat-transfer sheet 38 corresponding to the bolt holes 40 have about the same size as the bolt holes 40.

The ceiling electrode plate 31 having the above-described structure is supported to be suspended from the electrode support 33 by interposing the cooling plate 32 between the ceiling electrode plate 31 and the electrode support 33 and is fixed to a predetermined position inside the chamber 11 (refer to FIG. 1).

According to the current embodiment, since the heat-transfer sheet 38 is provided in the contact surface 31a between the ceiling electrode plate 31 and the cooling plate 32, the heat-transfer sheet 38 fills minute gaps provided in the contact surface between the ceiling electrode plate 31 and the cooling plate 32 and improve heat-transfer efficiency between the ceiling electrode plate 31 and the cooling plate 32, and thus heat from the ceiling electrode plate 31 may be effectively transferred to the electrode support 33 via the cooling plate 32. Accordingly, the ceiling electrode plate 31 may be effectively cooled by the electrode support 33, and thus a temperature of the ceiling electrode plate 31 is stabilized, and for example, a temperature of the ceiling electrode plate 31 when the first wafer and the fifth wafer are processed in the same lot may be stabilized. Also, activation of radicals included in the process space S facing the ceiling electrode plate 31 is stabilized, and thus an average value of etching rates of the wafers is stabilized. In addition, even when a temperature inside the chamber is equal to or greater than 200° C., the temperature of the ceiling electrode plate 31 may be maintained to about 100° C., and thus thermal expansion of the ceiling electrode plate 31 may be prevented, thereby designing the plasma processing apparatus out of consideration of a clearance between the elements. Furthermore, abnormal discharge resulting due to the plasma entering a gap between elements inside the processing chamber may be prevented, and furthermore, generation of particles may be prevented.

According to the current embodiment, by providing the heat-transfer sheet 38 in the contact surface 31a between the ceiling electrode plate 31 and the cooling plate 32, heat-transfer efficiency between the ceiling electrode plate 31 and the cooling plate 32 may be improved, and the ceiling electrode plate 31 may diffuse heat via the cooling plate 32, thereby obtaining uniformity of heat distribution in the ceiling electrode plate 31.

According to the current embodiment, since an organic material of the heat-transfer sheet 38 is, for example, a heat-resistant adhesive agent or a rubber including silicon, the heat-transfer sheet 38 may be flexibly deformed, and thus even though the contact surface between the ceiling electrode plate 31 and the cooling plate 32 is slightly bent, the ceiling electrode plate 31 and the cooling plate 32 may be firmly adhered to each other. Also, a heat-transfer material of the heat-transfer sheet 38 is a ceramic filler formed of oxide, nitride, or carbide. Since the ceramic filler of, for example, 25 to 60 volume %, is contained in the heat-resistant adhesive agent or the rubber, heat may be nearly uniformly transferred throughout all areas of the heat-transfer sheet 38. Consequently, a temperature of the entire ceiling electrode plate 31 may be nearly uniformly adjusted.

A thermal conductivity of the heat-transfer sheet 38 is in a range between 0.5 and 2.0 W/m·K, for example. If the thermal conductivity is within the range, heat may be nearly uniformly transferred throughout all the areas of the heat-transfer sheet 38 as described above, and thus the temperature of the entire ceiling electrode plate 31 may be nearly uniformly adjusted.

In the current embodiment, the heat-resistant adhesive agent or the rubber including silicon for forming the heat-transfer sheet 38 is not particularly limited, and any material including silicon may be used to form the heat-transfer sheet 38. Preferably, the material for forming the heat-transfer sheet 38 may be a material having a cross-linked structure, as polyorganosiloxane containing siloxane units in the backbone. Thermally hardened polyorganosiloxane may be preferably used, and in addition to polyorganosiloxane which is a main material, a hardening agent (cross-linked polyorganosiloxane) may be used. Examples of a repeating unit structure of polyorganosiloxane may include a dimethylsiloxane unit, a phenylmethylsiloxane unit, a diphenylsiloxane unit, and the like. Also, denatured polyorganosiloxane having a functional group, such as a vinyl group, an epoxy group, or the like, may be used.

In the current embodiment, a heat-transfer material serving as a filler in the heat-transfer sheet 38 is a ceramic filler formed of oxide, nitride, or carbide. Specifically, examples of oxide may include alumina, magnesia, zinc oxide, silica, etc., examples of nitride may include aluminum nitride, boron nitride, silicon nitride, etc., and examples of carbide may include silicon carbide, etc. The ceramic filler may have a spherical shape, and the ceramic filler having an anisotropic shape may be oriented to maximize heat-transfer characteristics. In particular, the ceramic filler may be preferably formed of alumina, zinc oxide, aluminum nitride, boron nitride, silicon nitride, silicon carbide, or the like.

In the current embodiment, a thickness of the heat-transfer sheet 38 may be equal to or less than 100 μm, and preferably, in a range between 30 and 80 μm.

A certain amount of bends and surface roughness that are a result of a forming process may remain in the contact surface between the ceiling electrode plate 31 and the cooling plate 32. Accordingly, if the heat-transfer sheet 38 is excessively thin, the heat-transfer sheet 38 fills a gap provided in the contact surface between the ceiling electrode plate 31 and the cooling plate 32, and thus thermal integrity may not be secured. Meanwhile, if the heat-transfer sheet 38 is excessively thick, a combined thermal capacity of the ceiling electrode plate 31 and the heat-transfer sheet 38 is increased, and thus there is a possibility that a temperature increase in the ceiling electrode plate 31 may not be appropriate for performing a plasma etching process. If the thickness of the heat-transfer sheet 38 is in a range between 30 and 80 μm, the ceiling electrode plate 31 may be thermally stabilized by firmly adhering the heat-transfer sheet 38 to the ceiling electrode plate 31.

In the current embodiment, the thickness of the heat-transfer sheet 38 provided in the contact surface 31a between the ceiling electrode plate 31 and the cooling plate 32 may be different at a position facing a center portion of a substrate holding stage provided to face the ceiling electrode plate 31 via the process space S and at a position facing a peripheral portion of the substrate holding stage. In other words, a center portion of the ceiling electrode plate 31 facing a center portion of the susceptor 12 faces the process space S having a high plasma intensity, and thus a temperature of the center portion of the ceiling electrode plate 31 may be easily increased. Accordingly, the thickness of a portion of the heat-transfer sheet 38 at the center portion of the ceiling electrode plate 31 may be decreased compared to a thickness of the other portions of the heat-transfer sheet 38 to decrease thermal resistance and to adjust heat-transfer efficiency, thereby obtaining uniformity of an in-plane temperature and uniformity of an etching rate of the ceiling electrode plate 31.

Also, in the current embodiment, the heat-transfer sheet 38 may not be provided in the center portion of the ceiling electrode plate 31.

In the current embodiment, the heat-transfer sheet 38 may be provided in a contact surface between the electrode support 33 and the cooling plate 32. Accordingly, heat-transfer efficiency between the electrode support 33 and the cooling plate 32 is improved, and a cooling effect of the ceiling electrode plate 31 is increased by using the cooling plate 32 interposed between the ceiling electrode plate 31 and the electrode support 33, thereby further stabilizing the temperature of the ceiling electrode plate 31. Also, heat distribution inside the chamber 11 is improved, and thus an energy saving effect may be obtained.

In the current embodiment, a parting agent may be coated on the contact surface between the cooling plate 32 and the ceiling electrode plate 31, and specifically, to a contact surface between the cooling plate 32 and the heat-transfer sheet 38. The ceiling electrode plate 31 is an expendable element to be replaced with a new element after a predetermined period of time, while the cooling plate 32 is repeatedly used, and thus a surface of the cooling plate 32 after removing the ceiling electrode plate 31 when the predetermined period of time has elapsed may be cleanly maintained.

Examples of the parting agent may include a fluoride coating material, powder having good thermal conductivity, and the like, and preferably, a parting agent mainly including, for example, carbon or boron nitride, may be used.

According to the present invention, a ceiling electrode plate contacts an electrode support via a cooling plate, and heat-transfer sheet is provided in a contact surface between the ceiling electrode plate and the cooling plate, and thus heat-transfer efficiency between the ceiling electrode plate and the cooling plate is increased. Thus, a function of adjusting a temperature of the ceiling electrode plate by the electrode support may be successfully performed, thereby stabilizing the temperature of the ceiling electrode plate at an early stage. Therefore, the temperature of the ceiling electrode plate may be stabilized from when generation of plasma begins, and an etching process may be uniformly performed on a plurality of wafers.

In the above description, the present invention has been described by describing an embodiment thereof, but the present invention is not limited thereto.

Also, in the above-described embodiment, a substrate on which a plasma etching process is performed is not limited to a wafer for a semiconductor device, and various substrates used to form a flat panel display (FPD) including a liquid crystal display (LCD), etc., a photo mask, a CD substrate, a printing substrate, or the like may be used.

What is claimed is:

1. A ceiling electrode plate which is supported to be suspended from an electrode support including a temperature adjusting mechanism,
    wherein a cooling plate is provided between the ceiling electrode plate and the electrode support, the ceiling electrode plate having a plurality of first gas holes and the cooling plate having a plurality of second gas holes;
    a first heat-transfer sheet is coated on a contact surface of the ceiling electrode plate which is located between the ceiling electrode plate and the cooling plate by using a masking material to provide a plurality of openings corresponding to the first gas holes for the first heat-transfer sheet, the first heat-transfer sheet forming a single unitary heat-transfer sheet, wherein the first heat-transfer sheet is not coated on a predetermined area around each of the first gas holes, and wherein the opening, each first gas hole and each second gas hole are communicated with one another to provide a labyrinth-shaped space; and
    a parting agent is coated on a contact surface of the cooling plate which is located between the cooling plate and the first heat-transfer sheet.

2. The ceiling electrode plate of claim 1, wherein the first heat-transfer sheet is not coated on a circular area having a radius of 1.5 mm to 2.5 mm centering around the first gas holes.

3. The ceiling electrode plate of claim 1, wherein a thickness of the first heat-transfer sheet is equal to or less than 100 µm.

4. The ceiling electrode plate of claim 3, wherein the thickness of the first heat-transfer sheet is in a range between 30 and 80 µm.

5. The ceiling electrode plate of claim 3, wherein the ceiling electrode plate is provided to face a substrate holding stage via a process space, wherein the thickness of the first heat-transfer sheet is different at a position facing a center portion of the substrate holding stage and at a position facing a peripheral portion of the substrate holding stage.

6. The ceiling electrode plate of claim 1, wherein a second heat-transfer sheet is further provided between the electrode support and the cooling plate.

7. The ceiling electrode plate of claim 1, wherein thermal conductivity of the first heat-transfer sheet is in a range between 0.5 and 2.0 W/m·K.

8. A substrate processing apparatus which comprises a ceiling electrode plate and a substrate holding stage provided to face the ceiling electrode plate via a process space and performs a predetermined process on a substrate placed on the substrate holding stage, wherein the substrate processing apparatus comprises the ceiling electrode plate of claim 1.

* * * * *